(12) United States Patent
Redaelli et al.

(10) Patent No.: US 11,276,731 B2
(45) Date of Patent: Mar. 15, 2022

(54) ACCESS LINE FORMATION FOR A MEMORY ARRAY

(71) Applicant: Micron Technology, Inc., Boise, ID (US)

(72) Inventors: Andrea Redaelli, Calolziocorte (IT); Anna Maria Conti, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/534,952

(22) Filed: Aug. 7, 2019

(65) Prior Publication Data

US 2021/0043685 A1 Feb. 11, 2021

(51) Int. Cl.
*H01L 27/24* (2006.01)
*H01L 27/11514* (2017.01)
*H01L 21/3213* (2006.01)
*H01L 21/768* (2006.01)
*H01L 23/528* (2006.01)
*H01L 45/00* (2006.01)

(52) U.S. Cl.
CPC .... *H01L 27/2481* (2013.01); *H01L 21/32133* (2013.01); *H01L 21/76837* (2013.01); *H01L 21/76892* (2013.01); *H01L 23/528* (2013.01); *H01L 27/11514* (2013.01); *H01L 27/2427* (2013.01); *H01L 45/06* (2013.01); *H01L 45/1233* (2013.01); *H01L 45/1253* (2013.01); *H01L 45/143* (2013.01); *H01L 45/1608* (2013.01)

(58) Field of Classification Search
None
See application file for complete search history.

(56) References Cited

U.S. PATENT DOCUMENTS

2015/0028280 A1* 1/2015 Sciarrillo ............ H01L 27/2463 257/4
2018/0026077 A1* 1/2018 Wu ........................ H01L 45/144 257/4

* cited by examiner

*Primary Examiner* — Robert K Carpenter
(74) *Attorney, Agent, or Firm* — Holland & Hart LLP

(57) ABSTRACT

Methods, systems, and devices for access line formation for a memory array are described. The techniques described herein may be used to fabricate access lines for one or more decks of a memory array. In some examples, one or more access lines of a deck may be formed using an independent processing step. For example, different fabrication processes may be used to form a plurality of access lines in a deck and to form the pillars (e.g., the memory cells) that are coupled with the access lines. In some examples, an offset between the access lines and the pillars may exist due to the components being fabricated in different processing steps.

27 Claims, 10 Drawing Sheets

ACCESS LINE FORMATION FOR A MEMORY ARRAY

BACKGROUND

The following relates generally to forming a memory array and more specifically to access line formation for a memory array.

Memory devices are widely used to store information in various electronic devices such as computers, wireless communications devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memory technologies, and others.

Forming memory devices and other devices (e.g., integrated circuits of any type) may include the formation of intersecting lines. Improved techniques for fabricating memory devices or other devices (e.g., faster, lower-cost) with uniform feature sizes or other beneficial features may be desired

DETAILED DESCRIPTION

Figure 1:
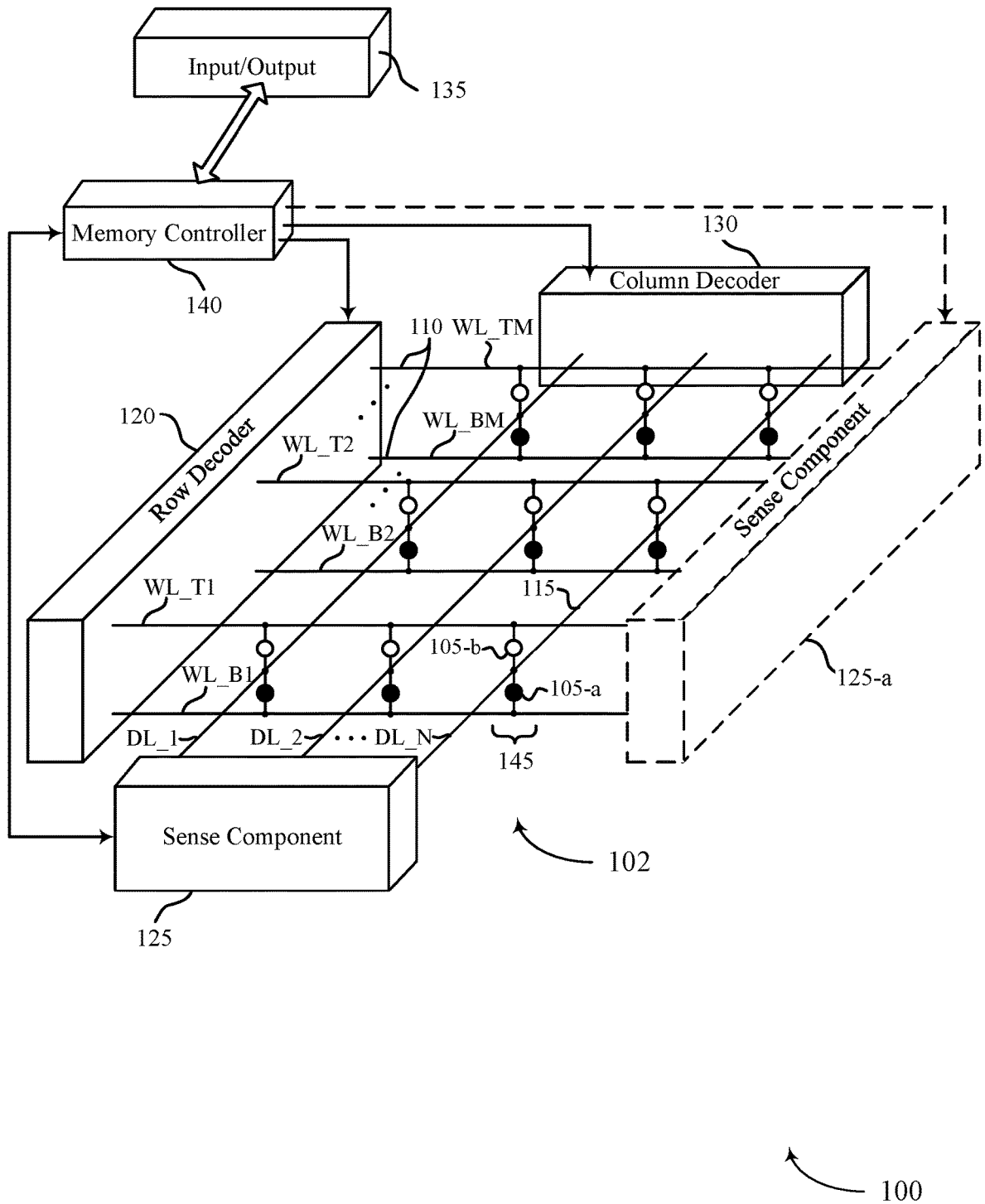
FIG. 1 illustrates an example memory device including a three-dimensional array of memory cells that supports access line formation for a memory array in accordance with examples as disclosed herein.

The cross-sectional area of particular components of a memory array may vary from deck-to-deck. The areas (e.g., the thicknesses) of the particular components may vary due to the patterning steps performed to construct the array. For example, various patterning steps, such as orthogonal patterning steps, may be performed on a stack of materials of a particular deck of the array. Because each material in a particular deck may be associated with a different etch rate (e.g., a different etch rate than an adjacent material; a different etch rate than other materials in the stack and/or deck) and/or may be etched using different etchants, different materials within the stack may be etched at different rates when using a same etchant. Thus, the etching process may result in different materials being etched differently. In the case of a memory device having multiple decks, similar components in each deck may have varying areas (e.g., thicknesses) and/or shapes (e.g., components having a tapered profile), which may result in each deck possessing different electrical resistances (e.g., different parasitic resistances).

In some cases, certain decks of a memory device may possess different electrical resistances due to the differences of the dimensions of the access lines (e.g., a word line or a digit line) in the respective decks. For example, a first deck (e.g., a bottom deck) in a memory device may include a word line and a digit line that is shared with a second deck (e.g., an adjacent deck, a deck above the first deck). Similarly, a top deck of the array (e.g., a deck above at least the first deck) may include a word line and a digit line that is shared with a lower deck (e.g., a deck below the top deck). When forming the memory array, the etching process used to form each deck may result in the top access line (e.g., the word line of the top deck) having different dimensions than the bottom access line (e.g., the word line of the first deck). The varying dimensions may result in these access lines possessing different electrical resistances, which may result in increased power consumption and/or non-uniform signal transmission across the decks of memory cells. Accordingly, techniques for forming memory devices having more-uniform components (and more-uniform electrical resistances) across multiple decks are described herein.

In some examples, a memory array having uniformly-sized components (e.g., more-uniformly-sized access lines) across decks may be formed by using one or more dedicated processing steps for forming an access line. For example, an access line layer (e.g., a metallization layer) may be deposited and subsequently etched (e.g., cut) in a first direction to form a plurality of access lines (e.g., a plurality of word lines) using dedicated processing steps. A stack of materials may be deposited over (e.g., above) the access lines and subsequently etched in the first direction to form a plurality of lines. In some examples, another access line layer may be deposited above the plurality of lines and etched (e.g., cut) in a second direction to form a plurality of pillars (e.g., including two or more electrodes and a memory cell such as a chalcogenide material) and a second plurality of access lines (e.g., a plurality of digit lines). In some examples, the techniques described herein may support various memory architectures or may be performed in different orders. For example, the dedicated processing steps may form the access lines of other decks, such as the word lines of the top deck. In some cases, the dedicated processing steps may result in an offset between the plurality of access lines and the plurality of pillars.

In some examples, the fabrication techniques described herein may realize one or more of the following advantages. The techniques may result in better delivery of signals (e.g., voltage signals or current signals) in a memory array, for instance, due to access lines having relatively similar dimensions (e.g., thicknesses). For example, forming and etching the first access lines before depositing the stack of material may result in reduced exposure of the memory material (e.g., of the stack) to contaminants that may otherwise arise from etching the first access lines. Additionally, such a process may provide more uniform thickness of access lines across a memory device, which may result in better (e.g., a more-uniform) signal delivery. The techniques described herein may also provide improved cell performance across multiple decks.

Features of the disclosure introduced above are further described herein in the context of constructing a three-dimensional memory device. Specific examples of structures and techniques for access line formation for a memory array are then described. These and other features of the disclosure are further illustrated by and described with reference to apparatus diagrams, method of formation diagrams, and flowcharts that relate to access line formation for a memory array.

FIG. 1 illustrates an example memory device 100 including a three-dimensional array of memory cells that supports access line formation for a memory array in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102, though the teachings herein may also be used to form a 2D (single deck) memory array (among other device types). The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states (e.g., a multi-level cell). A memory cell 105 may, in some examples, include various types of memory cells—e.g., a self-selecting memory cell, a 3D XPoint™ memory cell, a PCM cell that includes a storage component and a selection component, a conductive-bridge RAM (CBRAM) cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another (e.g., array layers including two or more decks of memory cells and array electrodes). This may increase a number of memory cells that may be placed or created on a single die or substrate as compared with a single 2D array, which in turn may reduce production costs, or increase the performance of the memory device, or both. In the example depicted in FIG. 1, the 3D memory array 102 includes two levels of memory cells 105 (e.g., memory cell 105-a and memory cell 105-b); however, the number of levels may not be limited to two, and other examples may include additional levels (e.g., 4 levels, 8 levels, 16 levels, 32 levels). Each level may be aligned or positioned so that memory cells 105 may be aligned (exactly, overlapping, or approximately) with one another across each level, thus forming memory cell stacks 145. In some cases, levels of memory cells may be referred to as decks of memory cells.

In some examples, each row of memory cells 105 is connected to a word line 110, and each column of memory cells 105 is connected to a digit line 115. Both word lines 110 and digit lines 115 may also be generically referred to as access lines. Further, an access line may function as a word line 110 for one or more memory cells 105 at one deck of the memory device 100 (e.g., for memory cells 105 below the access line) and as a digit line 115 for one or more memory cells 105 at another deck of the memory device (e.g., for memory cells 105 above the access line). Thus, references to word lines and digit lines, or their analogues, are interchangeable without loss of understanding or operation. Word lines 110 and digit lines 115 may be perpendicular (or nearly so) to one another and may support an array of memory cells.

In general, one memory cell 105 may be located at the intersection of two access lines such as a word line 110 and a digit line 115. This intersection may be referred to as the address of the memory cell 105. A target memory cell 105 may be a memory cell 105 located at the intersection of an energized (e.g., activated) word line 110 and an energized (e.g., activated) digit line 115; that is, a word line 110 and a digit line 115 may both be energized in order to read or write a memory cell 105 at their intersection. Other memory cells 105 that are in electronic communication with (e.g., connected to, coupled with) the same word line 110 or digit line 115 may be referred to as untargeted memory cells 105.

As shown in FIG. 1, the two memory cells 105 in a memory cell stack 145 may share a common conductive line such as a digit line 115. That is, a digit line 115 may be coupled with the upper memory cell 105-b and the lower memory cell 105-a. Other configurations may be possible, for example, a third layer (not shown) may share a word line 110 with the upper memory cell 105-b.

In some cases, an electrode may couple a memory cell 105 to a word line 110 or a digit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a digit line 115, as well as in some cases to an additional conductive element employed as an electrical contact between an access line and a memory cell 105. In some examples, a memory cell 105 may comprise a chalcogenide material positioned between a first electrode and a second electrode. The first electrode may couple the chalcogenide material to a word line 110, and the second electrode couple the chalcogenide material with a digit line 115. The first electrode and the second electrode may be the same material (e.g., carbon) or different material. In other examples, a memory cell 105 may be coupled directly with one or more access lines, and electrodes other than the access lines may be omitted.

Operations such as reading and writing may be performed on memory cells 105 by activating or selecting word line 110 and digit line 115. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the digit line by a selection component. The word line 110 may be connected to and may control the selection component. For example, the selection component may be a transistor and the word line 110 may be connected to the gate of the transistor. Alternatively, the selection component may be a variable resistance component, which may include chalcogenide material. Activating the word line 110 may result in an electrical connection or closed circuit between the logic storing device of the memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, the 3D memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and digit line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, sense component 125 may read information stored in a selected memory cell 105 by detecting the current flow or lack thereof through the memory cell 105.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115, and at least one logic value may be stored in the memory cell 105. Column decoder 130 or row decoder 120 may accept data, for example input/output 135, to be written to the memory cells 105.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. In general, the amplitude, shape, polarity, and/or duration of an applied voltage or current described herein may be adjusted or varied and may be different for the various operations described in operating the memory device 100. Further, one, multiple, or all memory cells 105 within the 3D memory array 102 may be accessed simultaneously; for example, multiple or all cells of the 3D memory array 102 may be accessed simultaneously during a reset operation in which all memory cells 105, or a group of memory cells 105, are set to a single logic state.

The 3D memory array 102 may be positioned above a substrate that includes various circuitry, such as the row decoder 120, the sense component 125, the column decoder 130, or the like. In some cases, the 3D memory array 102 may include one or more memory cells 105 and access lines, such as a word line 110 or digit line 115, that are formed using the fabrication techniques described herein. For example, a conductive material (e.g., a metallization layer, which may include tungsten (W)) may be deposited and cut (e.g., etched) in a first direction to form a first plurality of access lines (e.g., a plurality of word lines 110). In some examples, the area between the word lines 110 (e.g., the gaps between the word lines 110; the area adjacent to each of the word lines 110) may be filled with a dielectric material. In some examples, a stack of materials may be deposited on (e.g., above) the plurality of word lines 110 (and the dielectric material).

A stack of materials may include one or more electrode materials and one or more memory cell materials such as chalcogenide. After being deposited, the stack of materials may be etched (e.g., in the first direction) to form a plurality of lines. The plurality of lines may extend in the first direction (e.g., in the "X" direction). Due to the deposition techniques used and described herein, the stack of materials may be offset from the word lines 110. For example, at least a portion of the stack of materials may overhang at least one word line 110. Accordingly, when forming the plurality of lines, the lines may be offset from a respective word line 110. However, a portion of each line may be in contact with a respective word line 110 such that a respective memory cell may be accessed when the respective word line 110 is selected.

After forming the plurality of lines, a dielectric material and/or a sealing material may be deposited between each line. For example, the area between each line (e.g., the gaps between the lines; the area adjacent to each of the lines) may be filled with a dielectric material. In some examples, a sealing material (e.g., silicon nitride (SiN)) may be deposited on at least one sidewall of each pillar, and the dielectric material may then be deposited. In some examples, a second layer of conductive material (e.g., a metallization layer, which may include tungsten (W)) may be deposited above the lines and a second cut (e.g., a second etch) may occur, which may result in a plurality of pillars. In some examples, each pillar may include a memory cell 105 that is coupled with a respective word line 110 and digit line 115.

In some examples, a second deck (e.g., a second deck having a plurality of pillars) may be formed above the first deck. To form a second deck, a second stack of materials may be formed above the second conductive material (e.g., or above the digit lines 115 in the case that the second conductive material is etched before the second deck is formed). After depositing the second stack of materials, the second stack may be cut in the second direction (e.g., in a "Y" direction). A top conductive material (e.g., a metallization layer, which may include tungsten (W)) may be deposited and subsequently etched (e.g., in the first direction) to form a plurality of pillars in the second deck. By utilizing the fabrication technique described herein, the access lines (e.g., the word lines 110 and/or the digit lines 115) may have a more-uniform thicknesses, which may result in overall power reduction of the memory array due to less voltage being needed to select and/or access the memory cells. Additionally or alternatively, more-uniform thicknesses may result in more uniform signal transmission, as well as other advantages as described herein.

Figure 2:
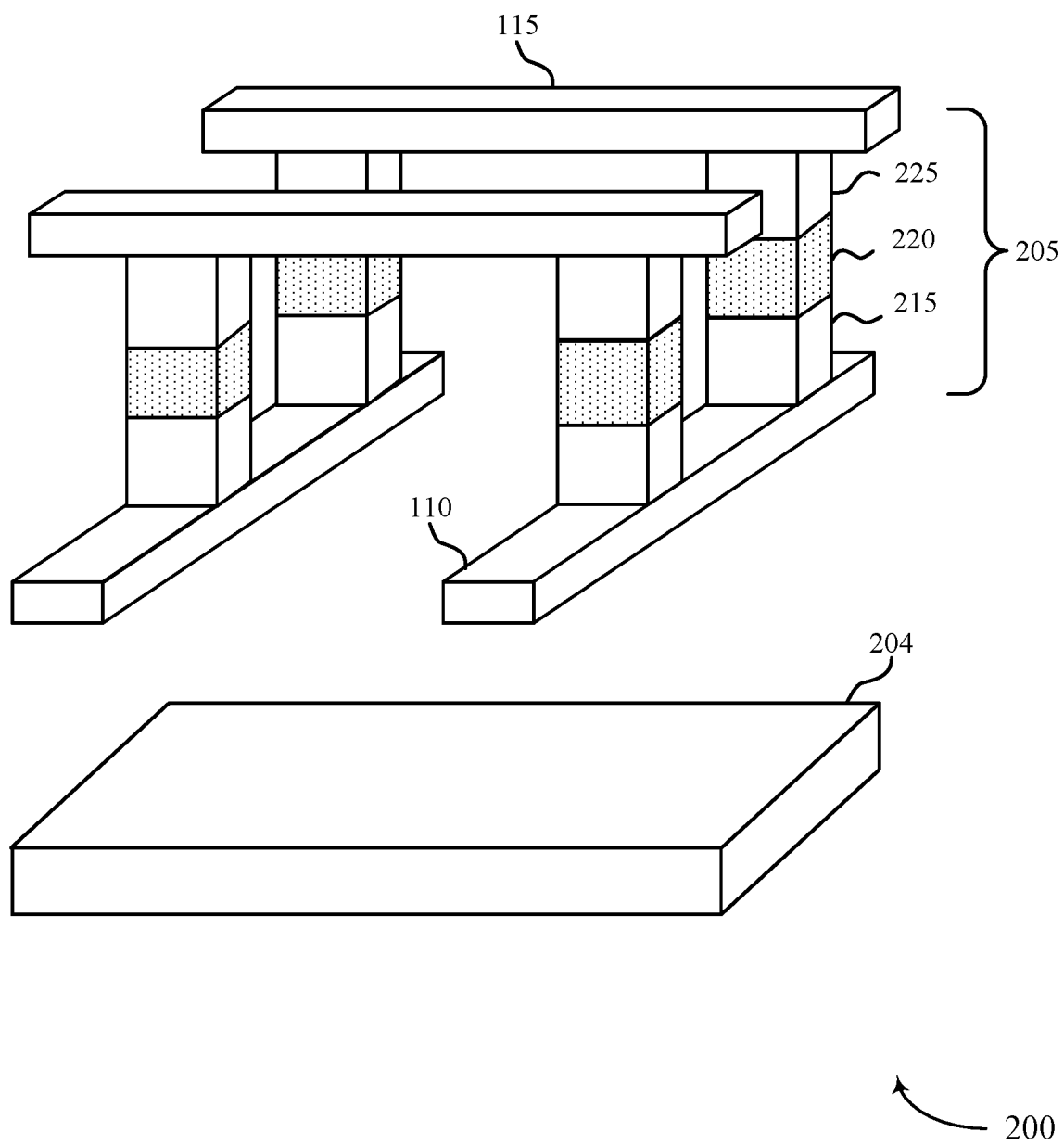
FIG. 2 illustrates an example of a memory array that supports access line formation for a memory array in accordance with examples as disclosed herein.

FIG. 2 illustrates an example of a memory array 200 that supports access line formation for a memory array in accordance with examples of the present disclosure. The memory array 200 may be an example of portions of memory array 102 described with reference to FIG. 1. In some examples, multiple instances of the memory array 200 may be replicated (e.g., formed and stacked on top of one another) to form a 3D memory device. The 3D memory device may include two or more decks of memory cells. The memory array 200 may include a deck 205 of memory cells (e.g., a first deck of memory cells) that is positioned above a substrate 204. In the case of a 3D memory array (not shown), the memory array 200 may include a second array or deck of memory cells on top of the first array or deck 205. The memory array 200 may also include word line 110 and digit line 115, which may be examples of word lines 110 and a digit line 115 as described with reference to FIG. 1.

As in the illustrative example depicted in FIG. 2, memory cells of the deck 205 may include a self-selecting memory cell. In some examples, memory cells of the deck 205 may include another type of memory cell that may be suitable for a cross-point architecture—e.g., a CBRAM cell, a 3D XPoint™ cell, an FeRAM cell. For example, the memory cells of the deck 205 (or of additional decks in the case of a 3D memory array) may include an additional selection component (e.g., a transistor or separate chalcogenide element configured for selection functionality). Although some elements included in FIG. 2 are labeled with a numeric indicator, other corresponding elements are not labeled, though they are the same or would be understood to be similar, in an effort to increase the visibility and clarity of the depicted features.

In some cases, memory cells of the deck 205 may each include first electrode 215, chalcogenide material 220, and second electrode 225. As used herein, materials included in a cell stack between a word line 110 and a digit line 115 may be considered as included in a memory cell and referred to collectively or individually as a memory cell material. For example, as described below with reference to FIGS. 3A through 3L, a memory cell material (e.g., memory cell material 315) may be understood as a composite (heterogenous, mixed, amalgamated) material and may include distinct materials included in a first electrode 215, a chalcogenide material 220, and/or a second electrode 225. In the context of a memory cell material, an etch rate may refer to an etch rate of any one material included in the memory cell material 315 (e.g., a slowest-etching or most etch-rate-limiting material included in the memory cell material 315) or an average or otherwise blended etch rate of the materials included in the memory cell material 315. In some cases, a combination of various materials (e.g., first electrode 215, chalcogenide material 220, second electrode 225) that may form a memory cell (e.g., memory cell 105-a, memory cell 105-b) may also be collectively referred to as a memory cell stack.

In some examples, access lines (e.g., word line 110, digit line 115) may include an electrode layer (e.g., a conformal layer), in addition to or in lieu of electrodes 215 or 225 and thus may comprise multi-layered access lines. In such examples, the electrode layer of the access lines may interface with a memory material (e.g., chalcogenide material 220). In some examples, access lines (e.g., word line 110, digit line 115) may directly interface with a memory material (e.g., chalcogenide material 220) without an electrode layer or an electrode in-between.

The memory cells of the deck 205 may, in some examples, have common conductive lines such that corresponding pillars may share digit lines 115 or word lines 110. For example, the electrode 225 and a top electrode of an adjacent pillar may both be coupled to digit line 115 such that digit line 115 is shared by adjacent memory cells (in an "X" direction).

In some examples, the memory array 200 may include an additional deck or additional decks of memory cells stacked on the deck 205. Each additional deck of memory cells may be aligned (e.g., vertically aligned in a y-direction) and may include an additional word line. Despite each additional deck being aligned, the first deck 205 may be misaligned with the word line 110. The word line 110 may be formed independent from the deck 205 (e.g., using a separate fabrication step). Accordingly, an overlap may exist between the electrode 215 and the word line 110 (not shown).

In some examples, an additional deck of memory cells may be coupled with the deck 205 such that a bottom electrode is coupled with the digit line 115 and a top electrode is coupled with the additional word line. The additional word line may be electrically isolated from the digit line 115 (e.g., an insulating material may be interposed between the additional word line and the digit line 115). As a result, the first deck 205 and each additional deck may be separated and may operate independently of each other. In some cases, an access line (e.g., either word line 110 or digit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of the memory array 200 may in some cases be referred to as an example of a cross-point architecture, as a memory cell may be formed at a topological cross-point between a word line 110 and a digit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor (e.g., a thin-film transistor), which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows a single memory deck 205, other configurations may include any number of decks (e.g., 2 decks, 4 decks, 8 decks, 16 decks, 32 decks). In some examples, one or more of the memory decks may include self-selecting memory cells that include chalcogenide material 220. In other examples, one or more of the memory decks may include FeRAM cells that include a ferroelectric material. In yet another examples, one or more of the memory decks may include a PCM cell that includes a storage component and a selection component. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some cases, word line 110 and digit line 115 of the memory array 200 may be referred to as access lines or array electrodes.

In some cases, one or more decks (such as first deck 205) of a memory device may be formed using the fabrication techniques described herein. For example, the memory array 200 may include multiple decks and may be formed using one or more fabrication techniques as described with reference to FIGS. 3A-3E. In some examples, the memory array 200 may include a first pillar that includes a first memory cell coupled with a first conductive line (e.g., word line 110) and a second conductive line (e.g., digit line 115). Due to the techniques employed to form the word line 110 (e.g., by using an independent processing step), the top-most and bottom-most word lines may have relatively uniform thicknesses, which may enable better signal delivery to the memory cells of each deck.

FIGS. 3A-3E illustrate example fabrication techniques that support access line formation for a memory array in accordance with examples of the present disclosure. FIGS. 3A-3E describe aspects of various process steps for forming an array of memory cells (e.g., a memory array 200 as described with reference to FIG. 2).

As an illustrative example of some of the techniques described herein, FIGS. 3A-3D include cross-sectional views of a portion of a single deck (e.g., a first deck 205 including memory cell stacks and access lines as described with reference to FIG. 2) to illustrate aspects of various processing steps for access line formation in accordance with examples of the present disclosure. The techniques described herein are not limited to a single deck (e.g., a single deck of memory cells). For example, the processing steps described herein may be used to form two or more decks of memory cells (e.g., a first deck, one or more intermediate decks, and a top deck of a stack of decks). Further, a particular implementation of forming the access lines is not limiting. For example, any processing techniques that use orthogonal or otherwise intersecting cuts may employ the techniques and processes described herein.

Figure 3A:
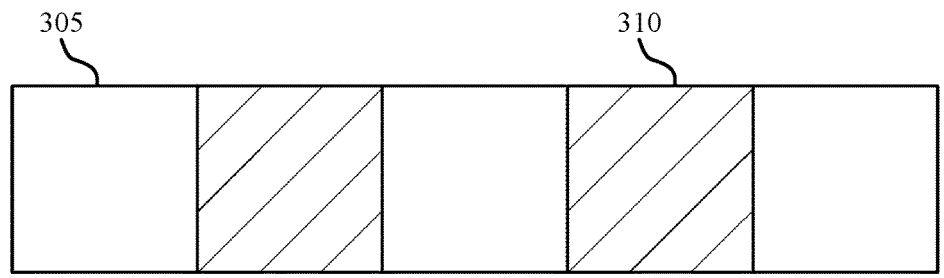
FIGS. 3A through 3E illustrate example fabrication techniques that support access line formation for a memory array in accordance with examples as disclosed herein.

In FIG. 3A, a first processing step for forming access lines of a memory array is shown. FIG. 3A may illustrate a dedicated process (e.g., a dedicated mask process) to form access lines. For example, in the processing step shown in FIG. 3A, a layer of first conductive material (e.g., a metallization layer) may be deposited and etched to form a plurality of access lines 305 in a first direction (e.g., the access lines extend in an "X" direction parallel to one another). The first conductive material may be or may include one or more conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like. The dedicated process may include other processing, such as masking steps, chemical mechanical polishing (CMP) processing steps, buffing steps, and the like. In some examples, the access lines may be an example of word lines 110 as described with respect to FIGS. 1 and 2.

A dielectric material 310 may be deposited in the gaps between the plurality of access lines 305. For example, the dielectric material 310 may located adjacent to (e.g., between) two or more access lines 305. In some examples the dielectric material may insulate each of the access lines 305. In other examples (not shown), a sealing material may be deposited on the sidewalls of the access lines 305. For example, a sealing material may be deposited on a sidewall of a first access line 305 that faces a sidewall of a second access line 305. The sealing material may be or may include, for example, silicon nitride (SiN). In some examples, the sealing material may be deposited before the dielectric material 310 and may further-insulate each of the access lines 305. The dedicated process may include other processing. For example, a CMP process, a buffing process, or both may occur to smooth the surface topography of the lines of the first conductive material (e.g., the access lines 305), the dielectric material 310, and/or the sealing material. In some examples, the formation of the access lines 305 in FIG. 3A may be accomplished using a dedicated mask (e.g., a word line mask) and etching process. For example, a masking material may be deposited prior to etching the access lines 305 conductive material. Additionally or alternatively, processing steps such as the removal of the masking material may occur. Thus, the access lines 305 (e.g., word lines) of a deck of memory cells may be realized with a dedicated mask and etching process. Such a dedicated mask and etching process may result in access lines with more uniform properties (e.g., more uniform parasitic resistances due to more uniform thicknesses between access lines formed in the dedicated process and access lines formed in prior or subsequent processing steps), among other advantages.

Figure 3B:
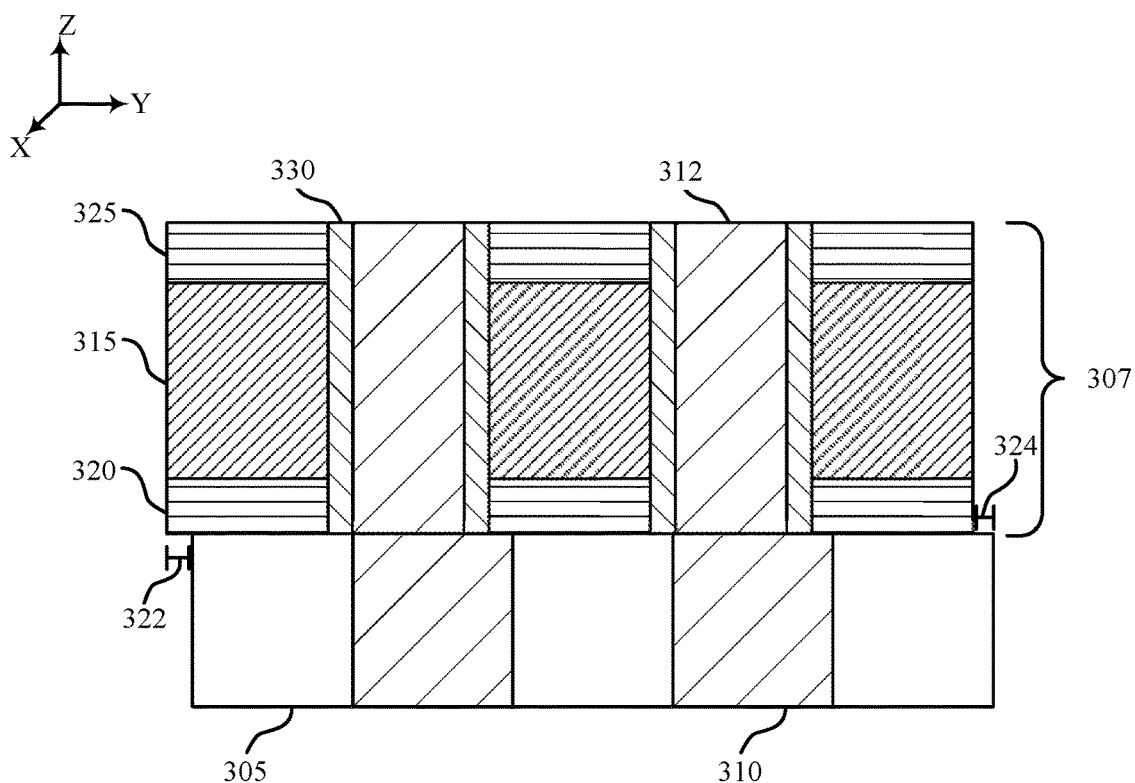

FIG. 3B illustrates a second processing step in accordance with aspects of the present disclosure. In some examples, a stack of materials 307 may be deposited on (e.g., over, above) the layer of first conductive material and dielectric material 310 formed in FIG. 3A. In some examples, the stack of materials 307 may include one or more electrode materials and one or more memory cell materials (e.g., chalcogenide materials). For example, the stack of materials 307 may include a memory cell material 315, which may be an example of the chalcogenide material 220 as described with reference to FIG. 2. The stack of materials 307 may also include electrode material 320 (e.g., electrode 215 as described with reference to FIG. 2), and electrode material 325 (e.g., electrode 225 as described with reference to FIG.

2). In some examples, the electrode material 320 and the electrode material 325 may be a same material.

In some examples, a removal of material in the first direction (e.g., a first cut extending in the "X" direction) may occur. In some examples, the first cut may result in a plurality of lines being formed. Each line may consist of the stack of materials 307 (e.g., the layers of electrode material 320, memory cell material 315, and electrode material 325) and may be separated from an adjacent line by a gap (e.g., a gap formed by the first cut; a void of material). In some examples, the first cut may affect the stack of materials 307—i.e., the first cut may not remove the dielectric material and/or the access lines 305.

In such examples, the access lines 305 may be formed using the dedicated mask process described in FIG. 3A, which may enable a relatively less aggressive etching process to cut (e.g., etch) the stack of materials 307. For example, the conductive material may require the use of a more-aggressive etchant (or a relatively-less aggressive etchant applied for a longer duration) than the stack of materials 307 (e.g., due to the materials of the stack of materials 307 having different properties than the conductive material). To form the access lines 305 by depositing and etching the conductive material (e.g., a metallization layer) and the stack of materials 307 in a first cut, the stack of materials 307 may be exposed to the more aggressive etchant, which may result in contamination of the stack of materials 307 during the more aggressive etching of the conductive material in the first cut. Additionally, using the more-aggressive etchant may result in asymmetry for the access lines for some decks, such as the first and last decks of a memory device (e.g., due to different access line properties such as thickness). Therefore, by separating the etching processes into two distinct steps (e.g., as described with reference to FIG. 3A and FIG. 3B, respectively) the access lines 305 may be formed at or near a target dimension (i.e., the access lines 305 may be formed having a desired dimension). In some examples, the target dimension may be a same or similar dimension as one or more interconnects (e.g., the electrode materials 320) that are coupled with a respective access line 305. Additionally or alternatively, using two distinct etching steps may prevent the stack of materials 307 (e.g., the memory cell material 315) from being damaged (e.g., due to contamination of the stack of materials 307 with the conductive material) and/or damaged by the process used to etch the conductive material (i.e., due to a more-aggressive etchant affecting the stack of materials 307).

In some examples, the first cut described herein may be defined to satisfy one or more parameters (e.g., a thickness target of access lines, a parasitic resistance threshold, and the like). As an example, a first cut may be desired to produce a plurality lines with a thickness between 35 nm and 45 nm after the associated fabrication process, which may include a CMP and buff processes.

In some examples, the etching of the stack of materials 307 may result in the stack being offset from the conductive material (e.g., offset from the access lines 305 and/or the dielectric material 310). For example, an outer-most surface of the stack of materials 307 may overlap (e.g., extend past) a respective surface of the conductive material in a second direction (e.g., in the "Y" direction). This overlap may result in a portion 322 of an outermost line extending past an outermost access line 305. Similarly, an opposite yet outer-most surface of the stack of materials 307 may not extend past a respective surface of the conductive material in the second direction. This may result in a portion 324 of an outermost access line 305 extending past an outermost line. In some examples, the stack of materials 307 may be offset from the conductive material due to the materials being deposited in different processing steps. In other examples, the portion 322 and/or the portion 324 overlapping the access line 305 may be a result of one or more processing steps. That is, the overlap may be a result of the etching process. Thus, the portion 322 and/or the portion 324 overlapping the access line 305 may exist after the plurality of lines are formed over the access lines 305. Additionally or alternatively, each line may be offset (e.g., slightly offset) from a respective access line 305. However, in some examples, each line may remain in electrical contact with a respective access line 305 such that signaling (e.g., to and from a respective memory cell) is not impacted.

The first cut of the stack of materials 307 illustrated in FIG. 3B may result in a plurality of lines formed over the access lines 305. For example, lines formed in the stack of materials 307 (including the memory cell material 315, electrode material 320, and electrode material 325) may be formed over a portion of each respective access line 305 as depicted in FIG. 3B. In some examples, the lines may be offset from each respective access line 305 in the first direction (e.g., as illustrated by a portion 322 of an outermost line extending past a respective access line 305, and a portion 324 of an outermost access line 305 extending past an outermost line). Depositing the conductive material and stack of materials 307 in distinct processing steps may result in the materials being offset. Accordingly, forming the access lines 305 independently may result in a mis-alignment or offset between the access lines 305 and the lines formed in the stack of materials 307.

In some examples, the gaps between the lines of memory cell material may be filled with one or more additional materials. For instance, the side-walls of the lines of memory cell material may be covered with a sealing material 330. In some examples, the sealing material 330 may be or may include silicon nitride (SiN). The sealing material 330 may be formed on one or more sidewalls of the lines formed by the first cut. For example, the sealing material 330 may be formed on the inner surfaces of the lines (e.g., the portions of the lines that face an adjacent line). In some examples, the sealing material 330 located on a sidewall of a line may be above (e.g., over; adjacent to in the "Z" direction) a portion of the dielectric material 310 separating the access lines 305. In other examples, the sealing material 330 may be located over a portion of the dielectric material 310 and/or a portion of a respective access line 305. Additionally or alternatively, the gaps may be filled with dielectric material 312, which may be a same or similar material as the dielectric material 310 as described with reference to FIG. 3A. Like the sealing material 330, the dielectric material 312 may be located over a portion of the dielectric material 310 and/or a portion of a respective access line 305. In some examples, further processing (e.g., CMP processing, buff processing, and the like) may occur to a top surface of the sealing material 330 and/or the dielectric material 312.

Figure 3C:
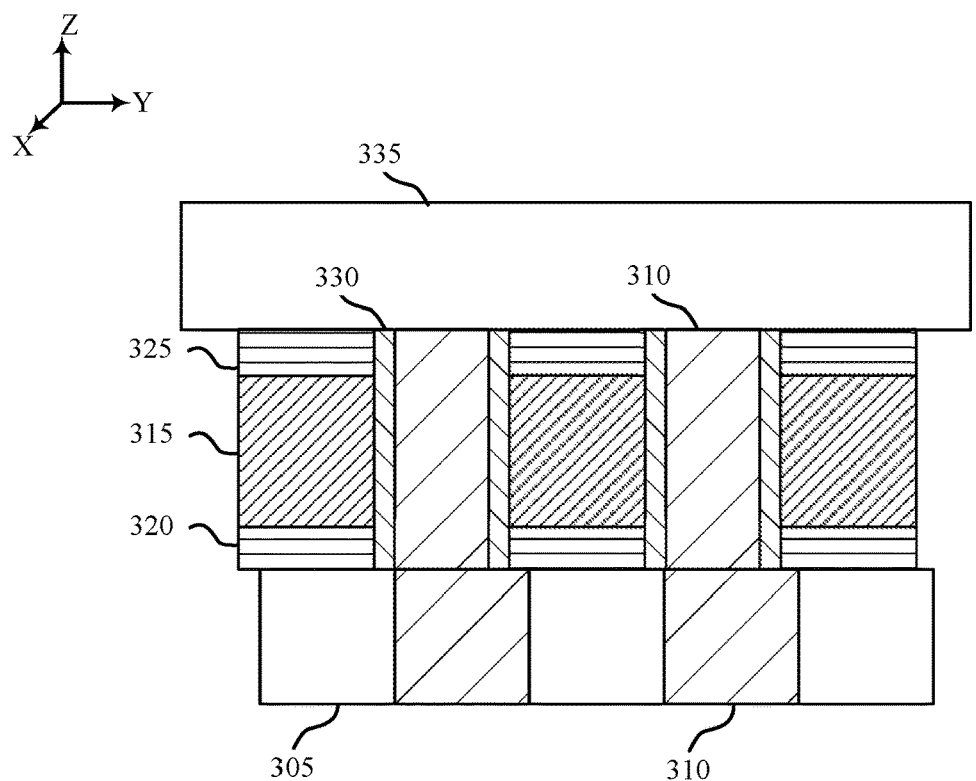

FIG. 3C illustrates a further processing step in accordance with aspects of the present disclosure. For example, a layer of second conductive material 335 (e.g., a metallization layer) may be deposited on top of the lines formed during the processing step described with reference to FIG. 3B. In some examples, the second conductive material 335 may be a same type of material as the first conductive material.

Figure 3D:
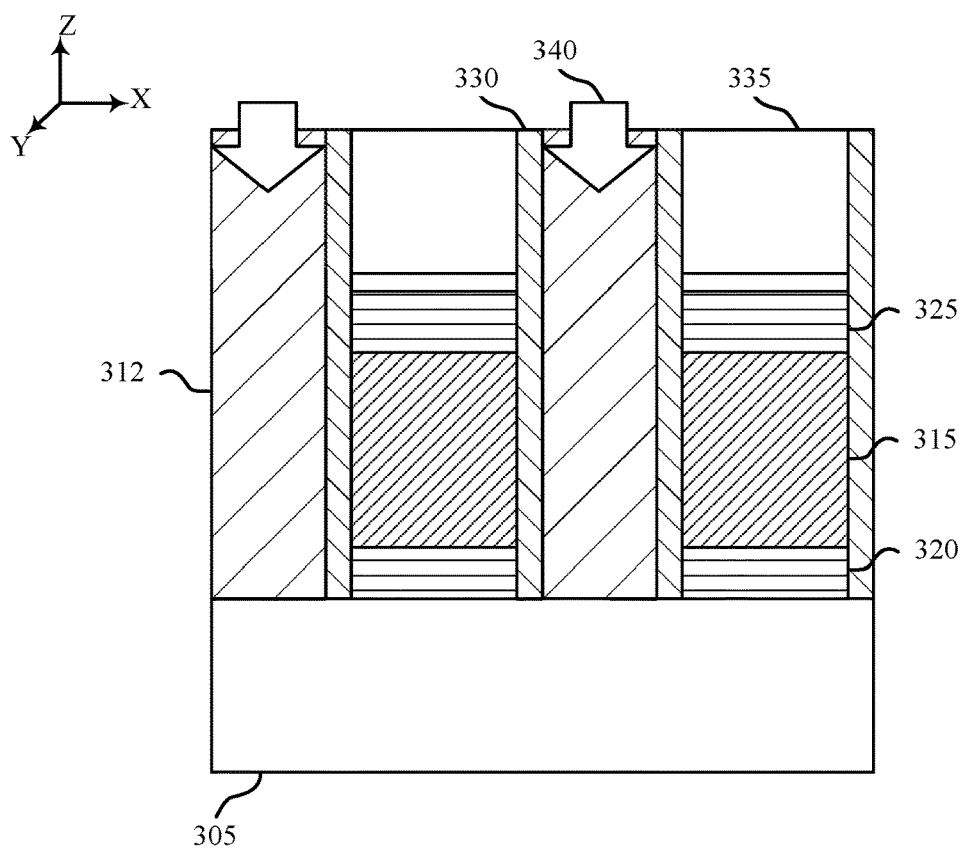

FIG. 3D illustrates another processing step in accordance with aspects of the present disclosure. FIG. 3D may illustrate a cross-sectional view of the memory device in the "Y"

direction. In some examples, a removal of material in the second direction may occur. That is, a second cut 340 (e.g., an etching process; a second etching process) may be performed to form pillars from the lines (e.g., the lines formed in the stack of materials 307 as described with reference to FIG. 3B). In some examples, the second cut may result in access lines (e.g., digit lines 115 as described with respect to FIG. 2) being formed in the conductive material 335. In some examples, the etching process used to perform the second cut may occur in multiple steps. For example, a more aggressive etching process (e.g., using a more-aggressive etchant, or a less-aggressive etchant for a shorter duration) may be used for a first duration to etch the conductive material 335. This may be due to the conductive material 335 being associated with a different etch rate than the stack of materials (e.g., the lines). In some examples, after the conductive material 335 has been etched, a relatively less-aggressive etching process may be used to etch the remaining materials in the stack. Due to the additional processing step used to form the access lines 305, the fabrication processes described herein may result in the access lines 305 and the access lines 335 having a same or similar dimension.

In some examples, the gaps between the access lines 335 may be filled with one or more materials. For example, additional sealing material 330 may be deposited on the exposed sidewalls of the pillars after the second cut. Additionally or alternatively, additional dielectric material 310 may be deposited adjacent to (e.g., between) the sealing material 330 (or between the exposed sidewalls of the pillars in the case that no sealing material 330 is deposited). The sealing material 330 and/or the dielectric material 310 may be deposited in the gaps (e.g., the areas between the pillars) that extend in the second direction. In some examples, further processing may occur, such as CMP and buff processing to smooth the surface topography of the memory array, masking process steps, etc.

The thickness of the second cut may be matched to the thickness of the access lines (e.g., the word lines formed by conductive material), due to the dedicated mask process used in forming the access lines 305. In some cases, such a dedicated masking process (e.g., as described in FIG. 3A) may result in the access lines 335 and the access lines 305 having more-uniform dimensions. Therefore, a deck of a memory device (e.g., the first deck) may be formed with more uniform access lines, which may realize one or more advantages.

Figure 3E:
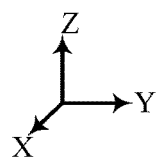
Figure 3E:
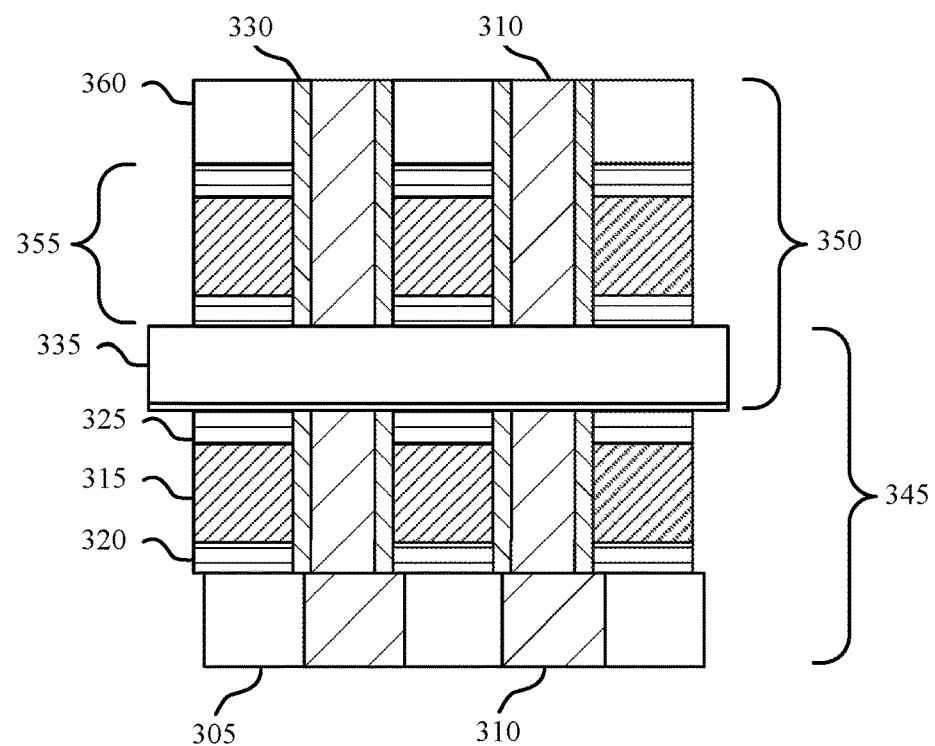

FIG. 3E illustrates an additional processing step in accordance with aspects of the present disclosure. For example, FIG. 3E includes a cross-sectional view of a memory array having multiple decks in accordance with examples of the present disclosure. In some examples, the first deck 345 may be the deck formed using the techniques described with respect to FIGS. 3A-3D. For example, there may be an offset between the access lines 305 (e.g., the word lines of the first deck) and the memory cells (e.g., the pillars of the memory cell material including memory cell material 315, electrode material 320, and electrode material 325). The offset may be in the first direction, the second direction, or both.

In some examples, the second deck 350 may be formed independent of or concurrent with forming the access lines 335. For example, after forming the first deck 345, the second conductive material 335 may be deposited above the first deck 345 and subsequently etched (e.g., in the second direction) to form a plurality of lines. In other examples, the second conductive material 335 may be deposited above the first deck 345, and a stack of materials 355 may be deposited above the second conductive material 335.

As shown in FIG. 3E, the stack of materials 355 may include the electrode material 320, the memory cell material 315, and the electrode material 325, but other materials may be included in the stack of materials 355. In some examples, a cut may be performed on the stack of materials 355 (and/or the second conductive material 335, depending on whether the second conductive material 335 was previously etched) to form a plurality of lines in the second direction (e.g., in the "Y" direction). For example, an etching process may remove material from the stack of materials 355 in the second direction to form the plurality of lines. Additional processing may be performed, such as filling the gaps between the plurality of lines in the second direction (e.g., with sealing materials such as sealing material 330 or filling materials such as dielectric material 310 as described with reference to FIG. 3B), CMP and buff processes (e.g., to make the top level of the deck planar, or nearly planar), etc.

In some examples, after forming the lines in the stack of materials 355, a layer of a third conductive material 360 (e.g., a metallization later) may be deposited above the lines. In some examples, the third conductive material 360 may be a same or similar material as the conductive material and the conductive material 335. A cut (e.g., a second etch) may be performed in the first direction (e.g., in the "X" direction) on the layer of the third conductive material 360 and a portion of the stack of materials 355. In some examples, the cut may extend to (e.g., stop at) at the access lines 335 (e.g., the access lines formed in FIG. 3D illustrated here as the digit lines of the first deck 345).

Performing the cut on the layer of the third conductive material 360 and a portion of the stack of materials 355 may result in a plurality of pillars formed in the second deck 350. Each pillar may include a memory cell and may be coupled with an access line 360 (e.g., a word line) and an access line 335 (e.g., a digit line). That is, each pillar may be co-planar with a respective pillar of the adjacent deck (i.e., a pillar of the first deck 345 may be co-planar with a respective pillar of the second deck 350). However, pillars from both the first deck 345 and the second deck 350 may be offset from the access lines 305.

In some examples, the fabrication processes described herein may result in the access lines 360 and the access lines 305 having same or similar dimensions. For example, the etching process used to perform the first cut (e.g., to form the access lines 360) may occur in multiple steps. For example, a more aggressive etching process (e.g., using a more-aggressive etchant, or a less-aggressive etchant for a shorter duration) may be used for a first duration to etch the conductive material 360. This may be due to the conductive material 360 being associated with a different etch rate than the stack of materials 355. In some examples, after the conductive material 360 has been etched, a relatively less-aggressive etching process may be used to etch the remaining materials in the stack. Due to the additional processing step used to form the access lines 305, the fabrication processes described herein may result in the access lines 305, the access lines 335, and the access lines 360 having a same or similar dimension.

In some examples, one or more aspects of the additional processing step of FIG. 3E may be repeated to form additional decks. For example, the process to form the second deck 350 may be repeated to form subsequent decks. Additionally or alternatively, the last deck of multiple decks may include access lines (e.g., word lines) formed in a dedicated process similar to the process described with respect to FIG.

3A. That is, the access lines of a top deck (e.g., the access lines 360 of the second deck 350) may be offset from the plurality of pillars (e.g., the stack of materials 355) of the last deck. The offset may be in the first direction, the second direction, or both. In some examples, forming the access lines of a bottom deck (e.g., the first deck 345), a top deck (e.g., the second deck 350), or both may result in more uniform dimensions or properties of the access lines in a memory device (e.g., between the access lines 360, the access lines 335, the access lines 360, and so on).

Figure 4A:
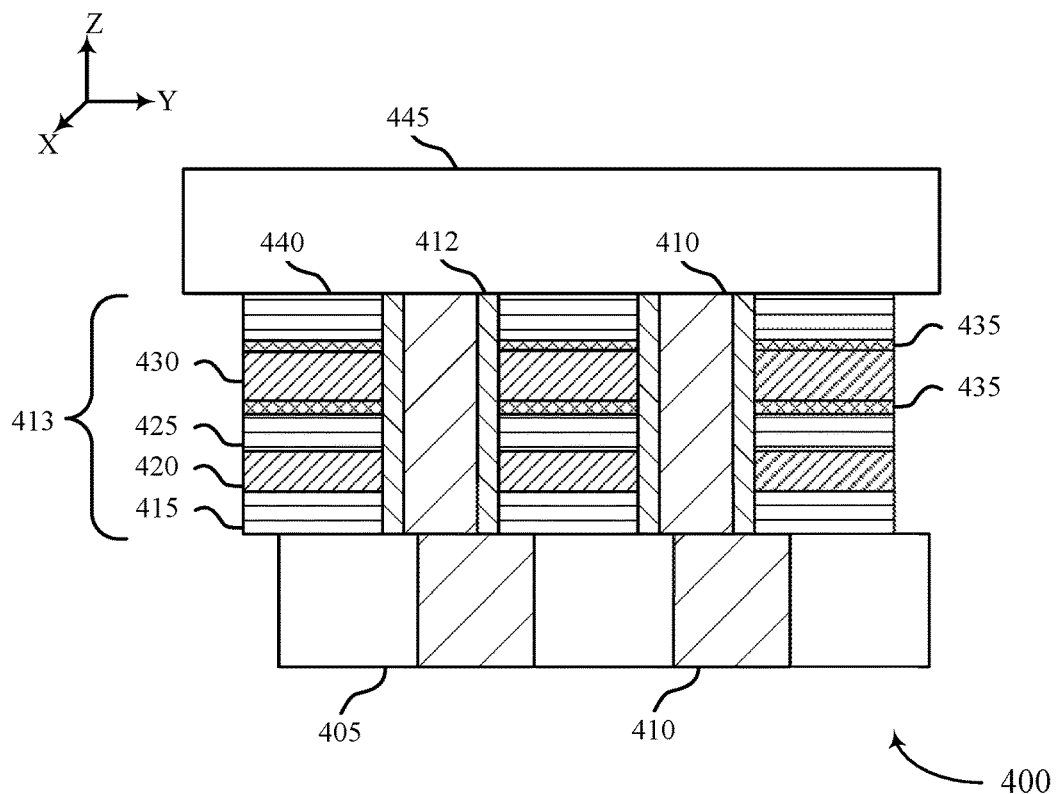
FIGS. 4A and 4B illustrate example fabrication techniques that support access line formation for a memory array in accordance with examples as disclosed herein.
Figure 4B:
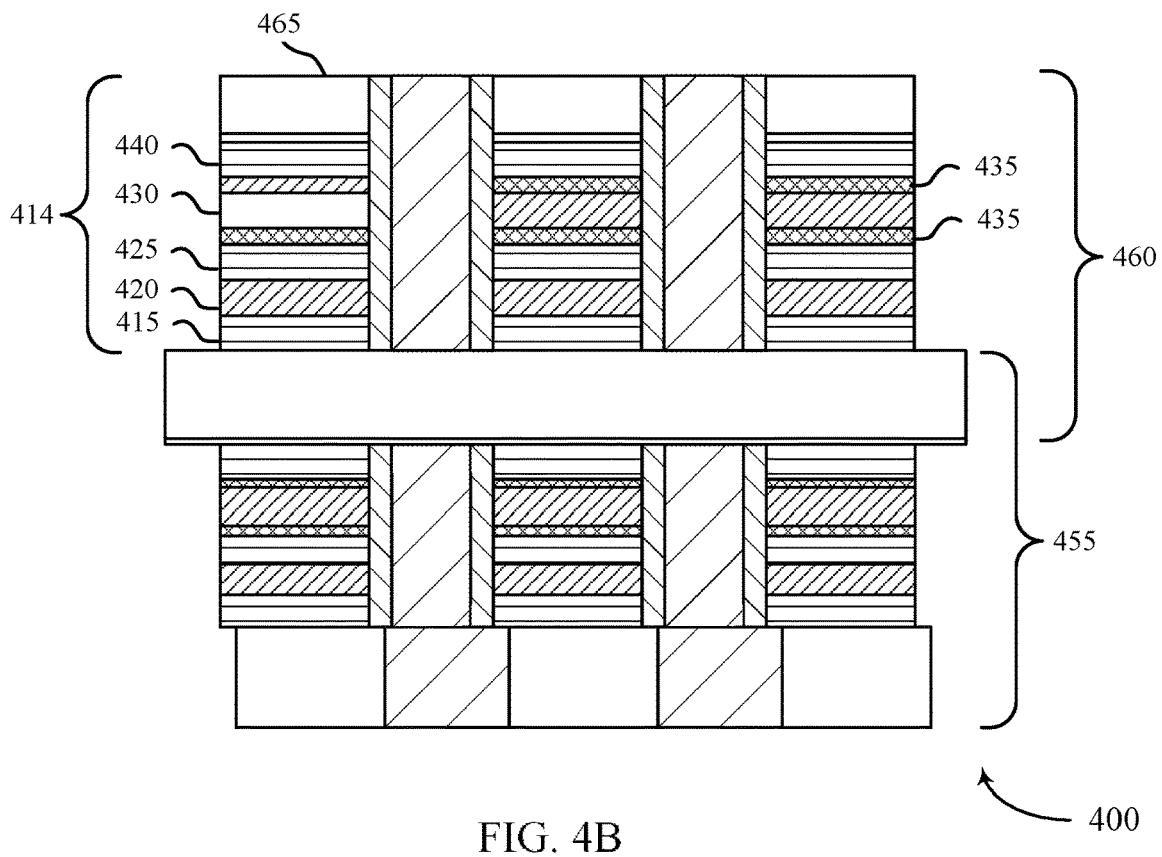

FIGS. 4A and 4B illustrate example fabrication techniques that support access line formation for a memory array in accordance with examples of the present disclosure. For example, FIGS. 4A and 4B include cross-sectional views of a memory array 400 to illustrate aspects of an example process in accordance with examples of the present disclosure. In some cases, the memory device may be formed by performing a first cut (e.g., a first etch) of a stack of material in a first direction and subsequently performing a second cut (e.g., a second etch) of the stack of material in a second direction (e.g., in an orthogonal or other intersecting, non-parallel direction). The resulting structure may include multiple pillars that each include a memory cell. Each pillar may be coupled with multiple access lines (e.g., a word line 110 and a digit line 115 as described with reference to FIG. 2) and may include a PCM cell, a CBRAM cell, a FeRAM cell, or a different type of memory cell. Additionally or alternatively, the same or similar fabrication techniques as described with reference to FIGS. 3A through 3E may be utilized to form the memory array 400. In some examples, the access lines depicted in FIGS. 4A and 4B may be formed to include more uniform properties from deck to deck or in a single deck, which may lead to several advantages.

FIG. 4A illustrates a cross-sectional view of a single deck of memory array 400 formed in accordance with examples of the present disclosure. For example, the memory array 400 may be formed using the techniques described in FIGS. 3A-3D. In some examples, the access lines 405, which may be an example of word lines 110, may be formed using dedicated processing steps (e.g., a dedicated mask process) similar to the process illustrated in FIG. 3A. For example, the dedicated process steps may include depositing and etching a conductive material into a first plurality of access lines 405 (e.g., access lines such as word lines 110). The gaps between the access lines 405 may be filled with a dielectric material 410, a sealing material (not shown), or both as described with respect to FIG. 3A. The dedicated process steps may also include other processing, such as masking steps (e.g., deposition of masking material prior to performing an etch, removal of masking material, and the like), CMP processing steps (e.g., to result in a planar surface or a nearly planar surface), buffing steps, and the like.

A stack of materials 413 may be deposited on (e.g., above; adjacent to in the "Z" direction) the access lines 405. In some examples, a first cut (e.g., a first removal of material; a removal of material in a first direction) may be performed. The first cut may be performed according to the process illustrated in FIGS. 3B-3D. In some examples, the stack of materials 413 may include a first electrode material 415, a selector material 420 (e.g., a chalcogenide material), a second electrode material 425, a memory cell material 430 (e.g., a chalcogenide material), a lamina material 435, a third electrode material 440, and a second conductive material 445. The first cut may form a plurality of lines of the stack of material 413 in the first direction. In some examples, the plurality of lines of the stack of material 413 and the access lines 405 may be offset, for example, due to forming the access lines 405 separately from performing the first cut on the stack of materials. In some examples, a second cut (e.g., a second removal of material; a removal of material in a second direction) may be performed. The second cut may form a plurality of pillars in the stack of materials 413 (and a plurality of lines in the conductive material 445). Additionally, other processing may occur throughout the process, such as the filling of gaps oriented in the second direction with materials such as sealing material 412 (e.g., lining the sidewalls of the pillars of the stack of material) and/or dielectric material 410. The other processing may also include CMP processing steps, buffing steps, and the like.

FIG. 4B illustrates a cross-sectional view of a memory array 400 that includes multiple decks in accordance with examples of the present disclosure. Memory array 400 may include a first deck 455. The first deck 455 may be formed as described with respect to FIG. 4A. Additionally or alternatively, the memory array 400 may include a second deck 460. The second deck 460 may be formed using a same or similar process as described with respect to FIG. 3E. For example, a stack of materials 414 may be deposited above the conductive material 445 (e.g., on the first deck 455; above the first deck 455; adjacent to the conductive material 445). The stack of materials 414 may include electrode material 415, a selector material 420 (e.g., a chalcogenide material), a second electrode material 425, a memory cell material 430 (e.g., a chalcogenide material), a lamina material 435, a third electrode material 440. In some examples, a first cut may be performed on the stack of materials 414. For example, a removal of material (e.g., up to the lines of second conductive material 445 of the first deck 455) from the stack of materials 414 may form a plurality of lines extending in the first direction. In some cases, the first cut may include other processing steps, such as masking steps, etching steps, CMP process steps, buffing steps, and the like.

A layer of a third conductive material 465 may be deposited. The third conductive material 465 may be a same type of material as the first conductive material deposited and etched to form the access lines 405, and the second conductive material deposited and etched to form the access lines 465. In some examples, a second cut may be performed on the lines (e.g., the lines formed by etching the stack of materials 414) and the layer of the third conductive material 465. For example, removal of material from the stack of materials 414 and the third conductive material 465 may form a plurality pillars and access lines 465. In some examples, the second cut may include other processing steps, such as masking steps, etching steps, CMP process steps, buffing steps, and the like. Additionally, the process illustrated in FIG. 4B may be repeated to form subsequent decks above the second deck 460.

The process described in FIGS. 4A and 4B may result in access lines with more uniform properties. For example, etching the access lines 405 of the first deck 455 in a dedicated process, rather than etching them through the stack of material 413 with varying etch rates in a first cut, may provide added control over the dimensions of the access lines 405 (e.g., because a less aggressive etch may be used in the first cut if the access lines 405 are formed), while reducing the chance of contamination of the stack of material 413 (e.g., with a conductive material of the access lines 405). As a result, the dimensions of the access lines 405 of the first deck 455 may be more consistent with the dimensions of other access lines (e.g., lines of conductive material 445; digit lines of the first deck 455 and the second deck 460).

Figure 5:
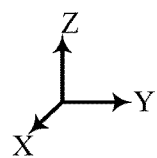
FIG. 5 illustrates an example fabrication technique that supports access line formation for a memory array in accordance with examples as disclosed herein.
Figure 5:
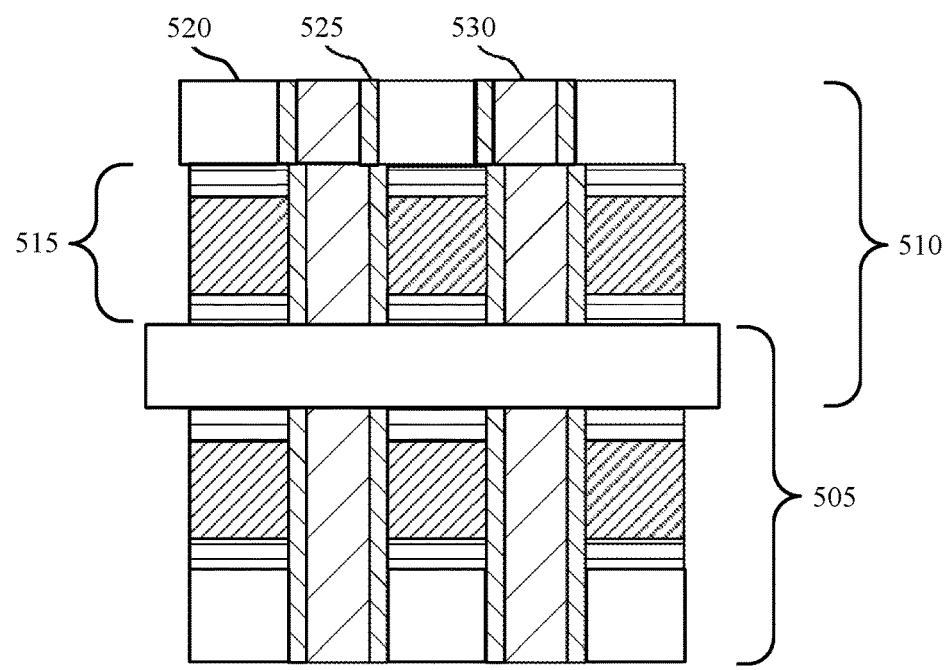

FIG. 5 illustrates an example fabrication technique that supports access line formation for a memory array in accordance with examples of the present disclosure. For example, FIG. 5 may include a cross-sectional view of a portion of a memory array 500 having multiple decks in accordance with examples of the present disclosure. The memory array 500 may include a first deck 505 and a second deck 510. In some examples, the decks may be formed according to the processing techniques described with respect to FIGS. 3A-3E. For example, the first deck 505 may be an example of the second deck 350 described with reference to FIG. 3E. That is, the first deck 505 may be formed by depositing a stack of materials above (e.g., on top of) a conductive material. Both the stack of materials and the conductive material may be etched (e.g., using a same etching process) to form a plurality of lines and a plurality of access lines (e.g., word lines). Additionally or alternatively, the second deck 510 may include access lines (e.g., word lines) that are formed using a dedicated process, such as a dedicated mask, as described with reference to FIG. 3A.

In some examples, one or more aspects of the second deck 510 may be formed using techniques described with respect to FIGS. 3A-3E. For example, the second deck 510 may include pillars formed from a stack of materials 515. The stack of materials 515 may include various memory cell materials, such as memory cell material 315, electrode material 320, and electrode material 325 as described with respect to FIG. 3E.

In some examples, the access lines (e.g., word lines such as word line 110) of the second deck 510 may be formed using the dedicated process steps described with respect to FIG. 3A. For example, after forming the pillars from the stack of materials 515, a conductive material may be deposited. In some examples, the conductive material may be etched (e.g., using a dedicated mask) to form access lines 520 atop the pillars. In some examples, gaps between the access lines 520 may be filled with various materials. For example, the gaps may be filled with a dielectric material 530 (e.g., to isolate the access lines 520). In some examples, a sealing material 525 may be deposited on a sidewall of a first access line that faces a sidewall of a second access line. The sealing material may be or may include, for example, silicon nitride (SiN). In some examples, the sealing material 525 may be deposited before a dielectric material 530 and may further-insulate each of the access lines. In some examples, the formation of the top access lines of the second deck 510 may be accomplished using a dedicated mask (e.g., a word line mask) and etching process.

In some examples, the dedicated process steps described in FIG. 5 may result in an offset between the access lines (e.g., the lines of conductive material 520) and the pillars of the stack of materials 515 (e.g., the memory cells). For example, an outer-most surface of a pillar in the second deck 510 may overlap (e.g., extend past) a respective surface of an access line 520 in a second direction (e.g., in the "Y" direction). This overlap may result in a portion of an outermost pillar extending past an outermost access line 520. Similarly, an opposite yet outer-most surface of a pillar in the second deck 510 may not extend past a respective surface of an access line 520. This may result in a portion of an outermost access line 520 extending past an outermost line. In some examples, the pillars of the second deck 510 may be offset from the access lines 520 due to the materials being deposited in different processing steps and/or due to the subsequent removal of material. Additionally or alternatively, each access line 520 may be offset (e.g., slightly offset) from a respective pillar. However, in some examples, each access line 520 may remain in electrical contact with a respective pillar such that signaling (e.g., to and from a respective memory cell) is not impacted.

Figure 6:
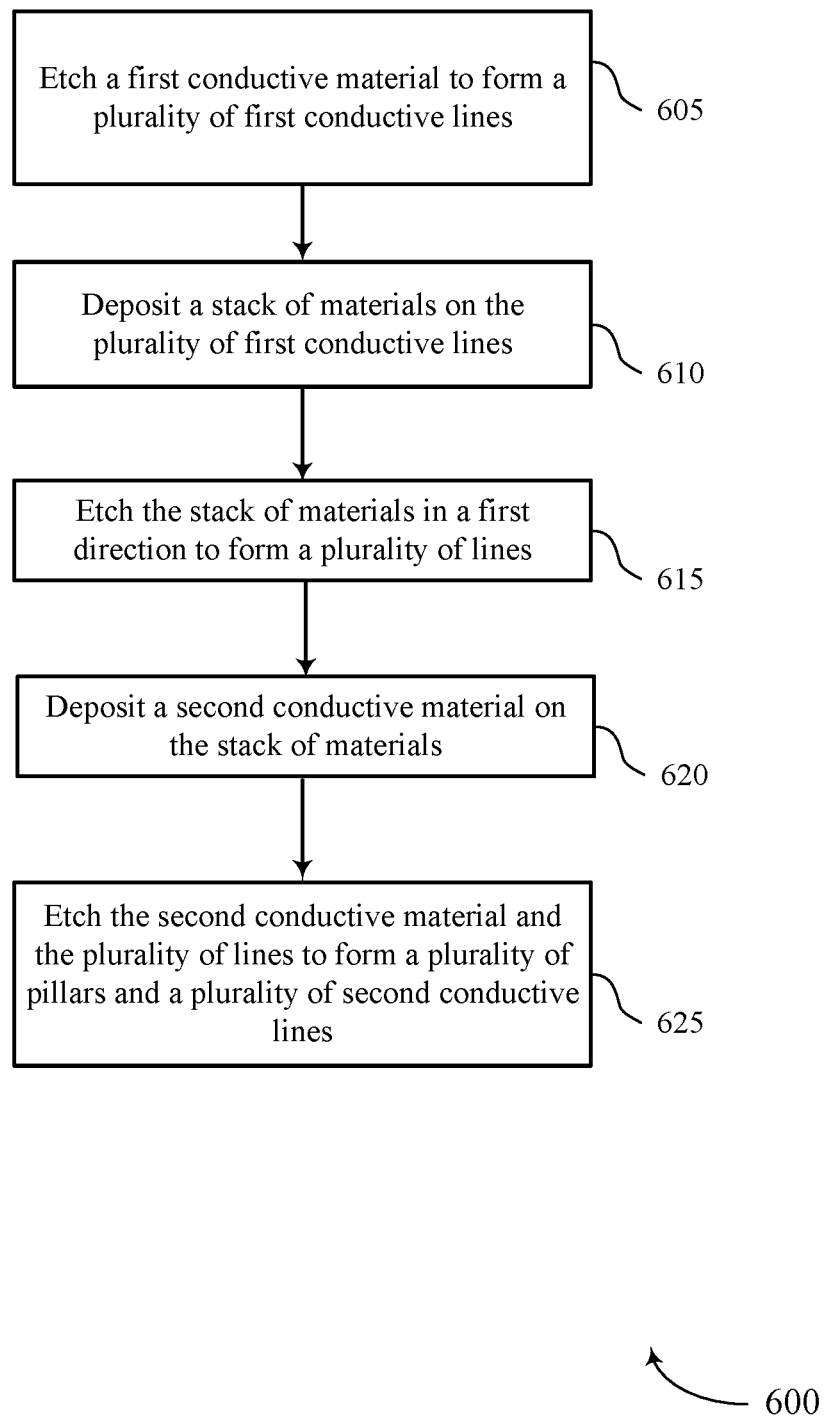
FIGS. 6-8 show flowcharts illustrating a method or methods that support access line formation for a memory array in accordance with aspects as disclosed herein.

FIG. 6 shows a flowchart illustrating a method or methods 600 that supports access line formation for a memory array in accordance with aspects of the present disclosure. The operations of method 600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 605, the method 600 may include etching a first conductive material to form a plurality of first conductive lines. The operations of 605 may be performed according to the methods described herein.

At 610, the method 600 may include depositing a stack of materials on the plurality of first conductive lines. The operations of 610 may be performed according to the methods described herein.

At 615, the method 600 may include etching the stack of materials in a first direction to form a plurality of lines. The operations of 615 may be performed according to the methods described herein.

At 620, the method 600 may include depositing a second conductive material on the stack of materials. The operations of 620 may be performed according to the methods described herein.

At 625, the method 600 may include etching the second conductive material and the plurality of lines to form a plurality of pillars and a plurality of second conductive lines. The operations of 625 may be performed according to the methods described herein.

In some examples of the method 600 and the apparatus described herein, depositing the stack of materials may include depositing a first electrode material above the plurality of first conductive lines, depositing the chalcogenide material above the first electrode material, and depositing a second electrode material above the chalcogenide material, where the second electrode material is in contact with the second conductive material. In some examples of the method and the apparatus, depositing the stack of materials may include depositing a first electrode material above the plurality of first conductive lines, depositing a selector material above the first electrode material, depositing a second electrode material above the selector material, depositing the chalcogenide material above the second electrode material, and depositing a third electrode material above the chalcogenide material, where the third electrode material is in contact with the second conductive material.

Some examples of the method 600 and the apparatus described herein may further include depositing a dielectric material between the plurality of first conductive lines and removing a portion of the first conductive material and the dielectric material, where an upper surface of the first conductive material is co-planar with an upper surface of the dielectric material based on the removing.

In some examples of the method 600 and the apparatus described herein, a lower surface of a pillar of the plurality of pillars may be in contact with a portion of the dielectric material. Some examples of the method and the apparatus may further include depositing a sealing material between the plurality of first conductive lines after etching the first conductive material and etching at least a portion of the sealing material between the plurality of first conductive lines, where the sealing material separates the dielectric material from the plurality of first conductive lines based at least in part on the etching.

Some examples of the method 600 and the apparatus described herein may further include depositing a sealing material between the plurality of lines and etching at least a portion of the sealing material between the plurality of lines, where the sealing material is coupled with a sidewall of a line of the plurality of lines. In some examples, the method and apparatus may further include depositing a dielectric material between the plurality of lines, where the sealing material separates the dielectric material from the plurality of lines, and removing a portion of the stack of materials, the sealing material, and the dielectric material, where a lower surface of the second conductive material is in contact with an upper surface of the stack of materials, the sealing material, and the dielectric material based at least in part on the removal.

Some examples of the method 600 and the apparatus described herein may further include depositing the first conductive material before etching the first conductive material to form the plurality of first conductive lines. Some examples of the method and the apparatus may further include depositing a second stack of materials above the second conductive material, the stack of materials including the chalcogenide material and a third conductive material, and etching the second stack of materials and the third conductive material in the first direction to form a plurality of second pillars.

Some examples of the method 600 and the apparatus described herein may further include depositing a second stack of materials above the second conductive material, etching the second stack of materials in the first direction to form a second plurality of lines, depositing a dielectric material between the second plurality of lines, masking at least a portion of a top surface of the second stack of materials and the dielectric material, depositing a third conductive material above the second stack of materials and the dielectric material, etching the third conductive material in the first direction to form a plurality of third conductive lines, and etching the second stack of materials, the dielectric material, and the plurality of third conductive lines in the second direction to form a plurality of second pillars.

In some examples of the method 600 and the apparatus described herein, a first sidewall and a second sidewall of the plurality of second pillars may be aligned with a respective first sidewall and a respective second sidewall of the plurality of pillars in a second direction. In some examples of the method and apparatus, the plurality of lines are formed after the plurality of first conductive lines are formed by etching the first conductive material.

It should be noted that the methods described above describe possible implementations, and that the operations and the steps may be rearranged or otherwise modified and that other implementations are possible. Furthermore, aspects from two or more of the methods may be combined.

An apparatus is described. In some examples, the apparatus may include a first conductive line extending in a first direction, a second conductive line extending in a second direction, and a pillar comprising a chalcogenide material, the pillar coupled with the first conductive line and the second conductive line, a first sidewall of the pillar being offset from a second sidewall of the first conductive line, and a third sidewall of the pillar being coplanar with a fourth sidewall of the second conductive line.

In some examples of the apparatus, the pillar may include a top electrode coupled with the second conductive line, the top electrode coupled with the chalcogenide material, and a bottom electrode coupled with the chalcogenide material, where the bottom electrode is in contact with the first conductive line.

In some examples, the pillar may include a top electrode coupled with the first conductive line, the top electrode coupled with the chalcogenide material, and a bottom electrode coupled with the chalcogenide material, wherein the bottom electrode is in contact with the second conductive line.

In some examples of the apparatus, the pillar may include a top electrode coupled with the second conductive line, the top electrode coupled with the chalcogenide material, a middle electrode coupled with the chalcogenide material, a selector device coupled with the middle electrode, and a bottom electrode coupled with the selector device, where the bottom electrode is contact with the first conductive line.

In some examples of the apparatus, the pillar may be in contact with an insulative material that is different than the first conductive line. In some examples, the apparatus may also include a dielectric material in contact with the second sidewall of the first conductive line, wherein the pillar is in contact with the first conductive line and the dielectric material.

In some examples, the apparatus may also include a sealing material located between the dielectric material and the first conductive line, the sealing material in contact with the second sidewall of the first conductive line, where the portion of the pillar is in contact with the first conductive line and the sealing material. In some examples, the apparatus may also include a second pillar comprising the chalcogenide material coupled with the second conductive line and a third conductive line, the first sidewall of the pillar being coplanar with a fifth sidewall of the second pillar, the fifth sidewall of the second pillar being offset from the second sidewall of the first conductive line.

Another apparatus is described. In some examples, the apparatus may include a word line extending in a first direction, a sidewall of the word line being in contact with an insulating material, a digit line extending in a second direction, and a pillar comprising a first electrode, a second electrode, and a chalcogenide material, where an upper surface of the second electrode is coupled with the digit line, a first portion of a bottom surface of the first electrode is coupled with the word line, and a second portion of the bottom surface of the first electrode is coupled with the insulating material.

In some examples of the apparatus, the pillar further includes a third electrode coupled with the chalcogenide material and a selector device coupled with the first electrode and the third electrode. In some examples of the apparatus, the insulating material may include a dielectric material and a sealing material, the sealing material being in contact with the sidewall of the word line. In some examples of the apparatus, the second portion of the bottom surface of the first electrode may be in contact with the sealing material.

Some examples of the apparatus may further include a second pillar located above the digit line, the second pillar comprising a fourth electrode, a second chalcogenide material, and a fifth electrode, where a first portion of the fourth electrode is located above the insulating material. In some examples of the apparatus, a second portion of the fourth electrode may be located above the word line.

Figure 7:
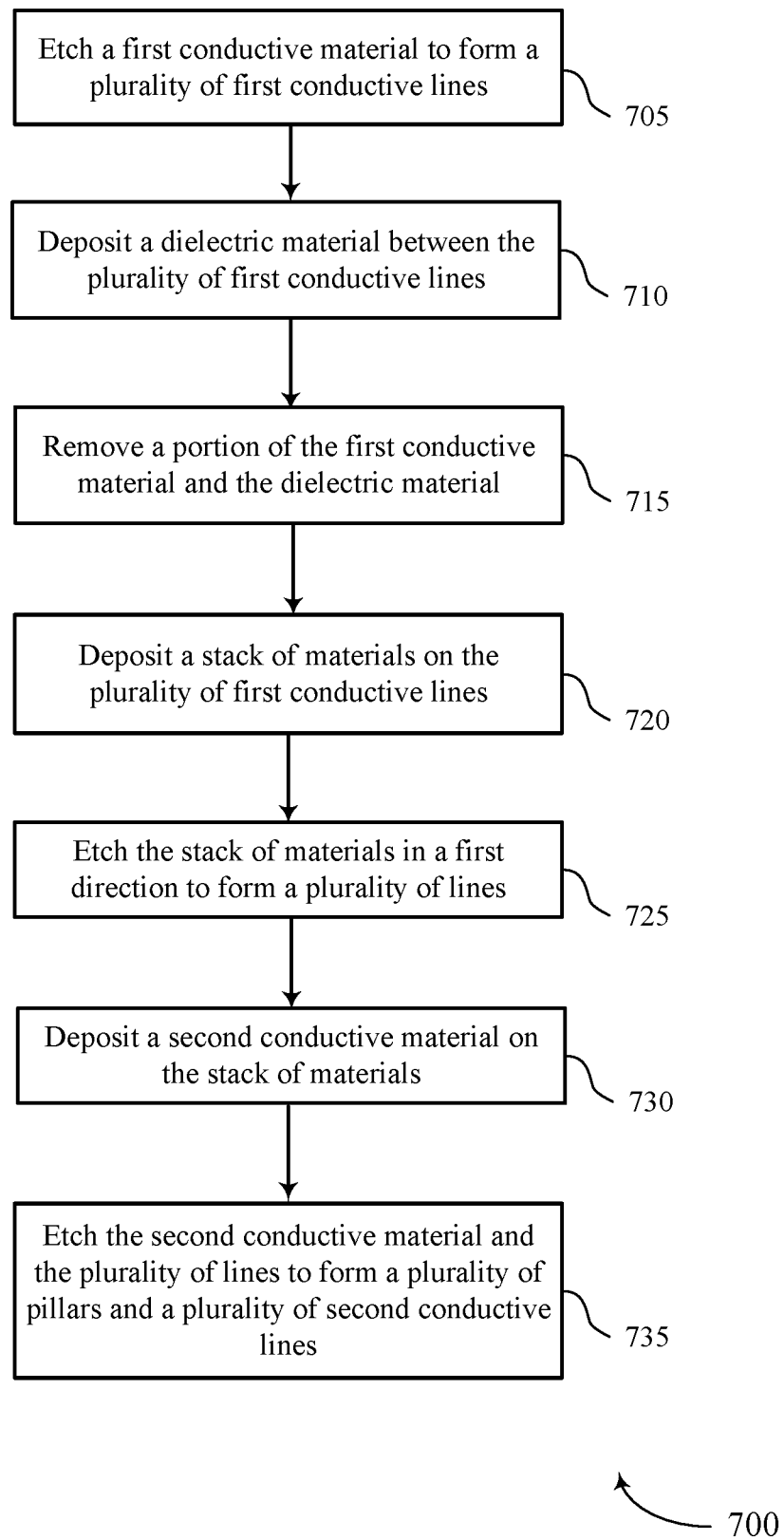

FIG. 7 shows a flowchart illustrating a method or methods 700 that supports access line formation for a memory array in accordance with aspects of the present disclosure. The operations of method 700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method 700 may include etching a first conductive material to form a plurality of first conductive lines. The operations of 705 may be performed according to the methods described herein.

At 710, the method 700 may include depositing a dielectric material between the plurality of first conductive lines. The operations of 710 may be performed according to the methods described herein.

At 715, the method 700 may include removing a portion of the first conductive material and the dielectric material. The operations of 715 may be performed according to the methods described herein.

At 720, the method 700 may include depositing a stack of materials on the plurality of first conductive lines. The operations of 720 may be performed according to the methods described herein.

At 725, the method 700 may include etching the stack of materials in a first direction to form a plurality of lines. The operations of 725 may be performed according to the methods described herein.

At 730, the method 700 may include depositing a second conductive material on the stack of materials. The operations of 730 may be performed according to the methods described herein.

At 735, the method 700 may include etching the second conductive material and the plurality of lines to form a plurality of pillars and a plurality of second conductive lines. The operations of 735 may be performed according to the methods described herein.

Figure 8:
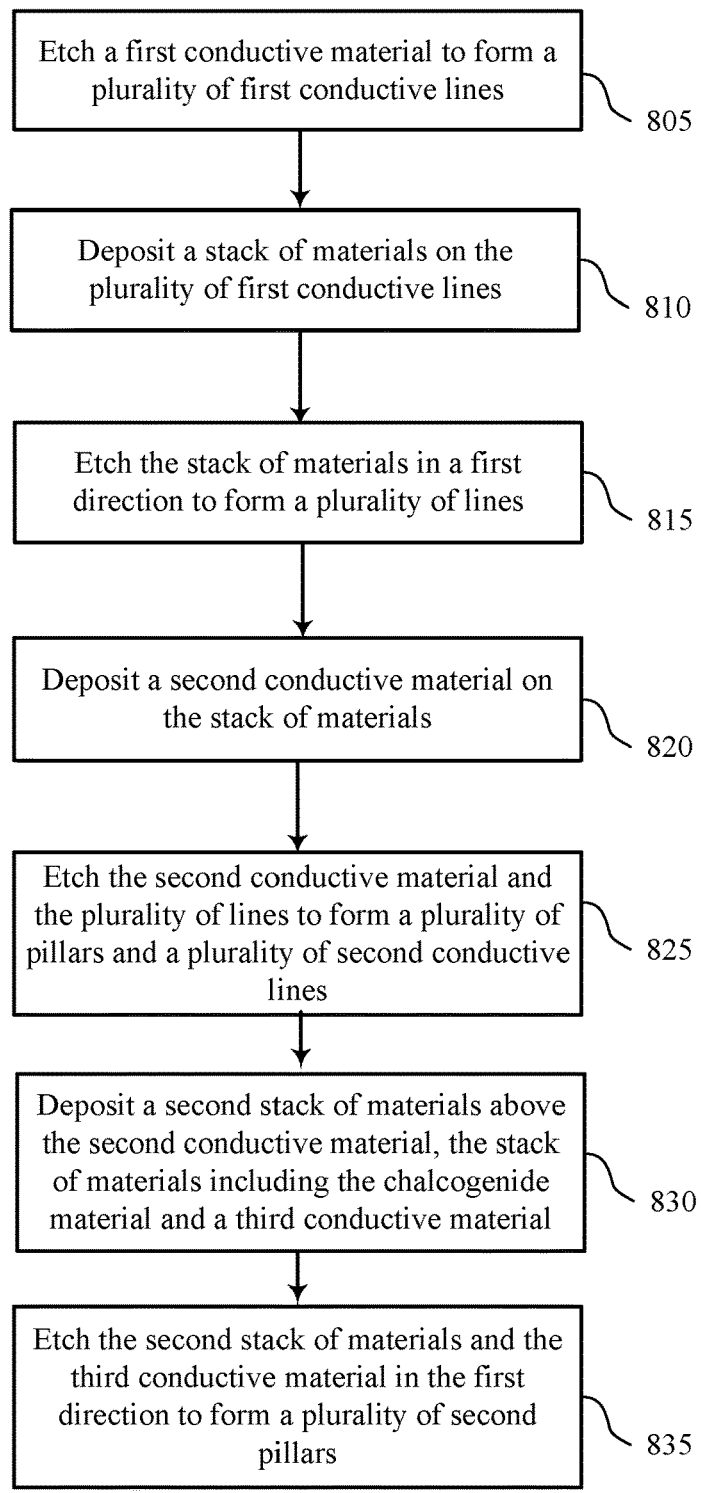

FIG. 8 shows a flowchart illustrating a method or methods 800 that supports access line formation for a memory array in accordance with aspects of the present disclosure. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include etching a first conductive material to form a plurality of first conductive lines. The operations of 805 may be performed according to the methods described herein.

At 810, the method 800 may include depositing a stack of materials on the plurality of first conductive lines. The operations of 810 may be performed according to the methods described herein.

At 815, the method 800 may include etching the stack of materials in a first direction to form a plurality of lines. The operations of 815 may be performed according to the methods described herein.

At 820, the method 800 may include depositing a second conductive material on the stack of materials. The operations of 820 may be performed according to the methods described herein.

At 825, the method 800 may include etching the second conductive material and the plurality of lines to form a plurality of pillars and a plurality of second conductive lines. The operations of 825 may be performed according to the methods described herein.

At 830, the method 800 may include depositing a second stack of materials above the second conductive material. The stack of materials may include the chalcogenide material and a third conductive material. The operations of 830 may be performed according to the methods described herein.

At 835, the method 800 may include etching the second stack of materials and the third conductive material in the first direction to form a plurality of second pillars. The operations of 835 may be performed according to the methods described herein.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line (e.g., access line), conductive layer (e.g., within a memory cell stack), or the like that provides a conductive path between elements or components of memory array.

The devices described herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor described herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
etching, based at least in part on a first mask, a first conductive material in a first direction to form a plurality of first conductive lines;
depositing, after etching the first conductive material, a stack of materials on the plurality of first conductive lines, the stack of materials comprising a chalcogenide material;
etching, after depositing the stack of materials, the stack of materials in the first direction to form a plurality of lines;
depositing a second conductive material on the stack of materials; and
etching, based at least in part on a second mask different from the first mask, the second conductive material and the plurality of lines in a second direction to form a plurality of pillars and a plurality of second conductive lines.

2. The method of claim 1, wherein depositing the stack of materials comprises:
depositing a first electrode material above the plurality of first conductive lines;
depositing the chalcogenide material above the first electrode material; and
depositing a second electrode material above the chalcogenide material, wherein the second electrode material is in contact with the second conductive material.

3. The method of claim 1, wherein depositing the stack of materials comprises:
depositing a first electrode material above the plurality of first conductive lines;
depositing a selector material above the first electrode material;
depositing a second electrode material above the selector material;
depositing the chalcogenide material above the second electrode material; and
depositing a third electrode material above the chalcogenide material, wherein the third electrode material is in contact with the second conductive material.

4. The method of claim 1, further comprising:
depositing a dielectric material between the plurality of first conductive lines; and
removing, before depositing the stack of materials, a portion of the first conductive material and the dielectric material, wherein an upper surface of the first conductive material is co-planar with an upper surface of the dielectric material based at least in part on the removing.

5. The method of claim 4, wherein a lower surface of a pillar of the plurality of pillars is in contact with a portion of the dielectric material.

6. The method of claim 4, further comprising:
depositing a sealing material between the plurality of first conductive lines after etching the first conductive material; and
etching at least a portion of the sealing material between the plurality of first conductive lines, wherein the sealing material separates the dielectric material from the plurality of first conductive lines based at least in part on the etching.

7. The method of claim 1, further comprising:
depositing a sealing material between the plurality of lines; and
etching at least a portion of the sealing material between the plurality of lines, wherein the sealing material is coupled with a sidewall of a line of the plurality of lines.

8. The method of claim 7, further comprising:
depositing a dielectric material between the plurality of lines, wherein the sealing material separates the dielectric material from the plurality of lines; and
removing a portion of the stack of materials, the sealing material, and the dielectric material, wherein a lower surface of the second conductive material is in contact with an upper surface of the stack of materials, the sealing material, and the dielectric material based at least in part on the removal.

9. The method of claim 1, further comprising:
depositing the first conductive material before etching the first conductive material to form the plurality of first conductive lines.

10. The method of claim 1, further comprising:
depositing a second stack of materials above the second conductive material, the stack of materials comprising the chalcogenide material and a third conductive material; and
etching the second stack of materials and the third conductive material in the first direction to form a plurality of second pillars.

11. The method of claim 10, wherein a first sidewall and a second sidewall of the plurality of second pillars is aligned with a respective first sidewall and a respective second sidewall of the plurality of pillars in the second direction.

12. The method of claim 1, further comprising:
depositing a second stack of materials above the second conductive material;
etching the second stack of materials in the first direction to form a second plurality of lines;
depositing a dielectric material between the second plurality of lines;
masking at least a portion of a top surface of the second stack of materials and the dielectric material;
depositing a third conductive material above the second stack of materials and the dielectric material;
etching the third conductive material in the first direction to form a plurality of third conductive lines; and
etching the second stack of materials, the dielectric material, and the plurality of third conductive lines in the second direction to form a plurality of second pillars.

13. A manufacturing system, comprising:
one or more controllers configured to execute a set of instructions to cause one or more functional elements of the manufacturing system to:
etch, based at least in part on a first mask, a first conductive material in a first direction to form a plurality of first conductive lines;
deposit, after etching the first conductive material, a stack of materials on the plurality of first conductive lines, the stack of materials comprising a chalcogenide material;
etch, after depositing the stack of materials, the stack of materials in the first direction to form a plurality of lines;
deposit a second conductive material on the stack of materials; and
etch, based at least in part on a second mask different from the first mask, the second conductive material and the plurality of lines in a second direction to form a plurality of pillars and a plurality of second conductive lines.

14. The manufacturing system of claim 13, wherein, to deposit the stack of materials, the one or more controllers are configured to execute the set of instructions to cause one or more functional elements of the manufacturing system to:
    deposit a first electrode material above the plurality of first conductive lines;
    deposit the chalcogenide material above the first electrode material; and
    deposit a second electrode material above the chalcogenide material, wherein the second electrode material is in contact with the second conductive material.

15. The manufacturing system of claim 13, wherein, to deposit the stack of materials, the one or more controllers are configured to execute the set of instructions to cause one or more functional elements of the manufacturing system to:
    deposit a first electrode material above the plurality of first conductive lines;
    deposit a selector material above the first electrode material;
    deposit a second electrode material above the selector material;
    deposit the chalcogenide material above the second electrode material; and
    deposit a third electrode material above the chalcogenide material, wherein the third electrode material is in contact with the second conductive material.

16. The manufacturing system of claim 13, wherein the one or more controllers are configured to execute the set of instructions to cause one or more functional elements of the manufacturing system to:
    deposit a dielectric material between the plurality of first conductive lines; and
    remove, before depositing the stack of materials, a portion of the first conductive material and the dielectric material, wherein an upper surface of the first conductive material is co-planar with an upper surface of the dielectric material based at least in part on the removing.

17. The manufacturing system of claim 16, wherein a lower surface of a pillar of the plurality of pillars is in contact with a portion of the dielectric material.

18. The manufacturing system of claim 16, wherein the one or more controllers are configured to execute the set of instructions to cause one or more functional elements of the manufacturing system to:
    deposit a sealing material between the plurality of first conductive lines after etching the first conductive material; and
    etch at least a portion of the sealing material between the plurality of first conductive lines, wherein the sealing material separates the dielectric material from the plurality of first conductive lines based at least in part on the etching.

19. The manufacturing system of claim 13, wherein the one or more controllers are configured to execute the set of instructions to cause one or more functional elements of the manufacturing system to:
    deposit a sealing material between the plurality of lines; and
    etch at least a portion of the sealing material between the plurality of lines, wherein the sealing material is coupled with a sidewall of a line of the plurality of lines.

20. The manufacturing system of claim 19, wherein the one or more controllers are configured to execute the set of instructions to cause one or more functional elements of the manufacturing system to:
    deposit a dielectric material between the plurality of lines, wherein the sealing material separates the dielectric material from the plurality of lines; and
    remove a portion of the stack of materials, the sealing material, and the dielectric material, wherein a lower surface of the second conductive material is in contact with an upper surface of the stack of materials, the sealing material, and the dielectric material based at least in part on the removal.

21. The manufacturing system of claim 13, wherein the one or more controllers are configured to execute the set of instructions to cause one or more functional elements of the manufacturing system to:
    deposit the first conductive material before etching the first conductive material to form the plurality of first conductive lines.

22. The manufacturing system of claim 13, wherein the one or more controllers are configured to execute the set of instructions to cause one or more functional elements of the manufacturing system to:
    deposit a second stack of materials above the second conductive material, the stack of materials comprising the chalcogenide material and a third conductive material; and
    etch the second stack of materials and the third conductive material in the first direction to form a plurality of second pillars.

23. The manufacturing system of claim 22, wherein a first sidewall and a second sidewall of the plurality of second pillars is aligned with a respective first sidewall and a respective second sidewall of the plurality of pillars in the second direction.

24. The manufacturing system of claim 13, wherein the one or more controllers are configured to execute the set of instructions to cause one or more functional elements of the manufacturing system to:
    deposit a second stack of materials above the second conductive material;
    etch the second stack of materials in the first direction to form a second plurality of lines;
    deposit a dielectric material between the second plurality of lines;
    mask at least a portion of a top surface of the second stack of materials and the dielectric material;
    deposit a third conductive material above the second stack of materials and the dielectric material;
    etch the third conductive material in the first direction to form a plurality of third conductive lines; and
    etch the second stack of materials, the dielectric material, and the plurality of third conductive lines in the second direction to form a plurality of second pillars.

25. A method, comprising:
    forming a plurality of first conductive lines based at least in part on etching a first conductive material in a first direction;
    forming a plurality of lines based at least in part on depositing a stack of materials on the formed plurality of first conductive lines, the stack of materials comprising a chalcogenide material, and etching the stack of materials in the first direction; and
    forming a plurality of pillars and a plurality of second conductive lines based at least in part on depositing a second conductive material on the formed plurality of lines and etching the second conductive material and the plurality of lines in a second direction.

26. The method of claim 25, further comprising:
depositing a dielectric material between the plurality of first conductive lines; and
removing, before depositing the stack of materials, a portion of the first conductive material and the dielectric material, wherein an upper surface of the first conductive material is co-planar with an upper surface of the dielectric material based at least in part on the removing.

27. The method of claim 25, further comprising:
forming a plurality of second pillars based at least in part on depositing a second stack of materials above the second conductive material, the stack of materials comprising the chalcogenide material, and etching the second stack of materials in the first direction; and
forming a plurality of third conductive lines based at least in part on depositing a third conductive material on the formed plurality of second pillars and etching the third conductive material in the first direction.

* * * * *